(12) United States Patent
Watson et al.

(10) Patent No.: US 8,670,267 B2
(45) Date of Patent: Mar. 11, 2014

(54) DATA STORAGE METHODS AND DEVICES

(75) Inventors: Chad S. Watson, Boise, ID (US);
William B. Knowlton, Boise, ID (US);
Peter Müllner, Boise, ID (US)

(73) Assignee: Boise State University, Boise, ID (US)

( * ) Notice: Subject to any disclaimer, the term of this patent is extended or adjusted under 35 U.S.C. 154(b) by 67 days.

(21) Appl. No.: 13/424,122

(22) Filed: Mar. 19, 2012

(65) Prior Publication Data

US 2012/0236632 A1  Sep. 20, 2012

Related U.S. Application Data

(63) Continuation-in-part of application No. 12/773,831, filed on May 4, 2010, which is a continuation of application No. 11/940,316, filed on Nov. 14, 2007, now Pat. No. 7,710,766.

(60) Provisional application No. 61/453,845, filed on Mar. 17, 2011, provisional application No. 60/859,163, filed on Nov. 14, 2006.

(51) Int. Cl.
*G11C 11/16* (2006.01)

(52) U.S. Cl.
USPC .......................................... 365/158; 365/171

(58) Field of Classification Search
USPC ................................. 365/33, 48, 55
See application file for complete search history.

(56) References Cited

U.S. PATENT DOCUMENTS

| | | | |
|---|---|---|---|
| 6,084,849 A | 7/2000 | Durig et al. | |
| 7,379,321 B2 * | 5/2008 | Ravelosona et al. | 365/145 |
| 7,570,510 B2 * | 8/2009 | Johnson | 365/158 |
| 7,586,828 B1 | 9/2009 | Ma | |
| 7,710,766 B2 | 5/2010 | Mullner et al. | |
| 2008/0225575 A1 * | 9/2008 | Mullner et al. | 365/157 |

OTHER PUBLICATIONS

Vettiger, P.; Cross, G.; et al; "The 'Millipede'—Nanotechnology Entering Data Storage;" IEEE Transactions on Nanotechnology, vol. 1, No. 1; pp. 39-55; Mar. 2002.
Jo, Ara; Joo, Wonchul; et al; "Ultrahigh-density phase-change data storage without the use of heating;" Nature Nanotechnology; vol. 4.; pp. 727-731; 2009.
Wright, C.D.; Shah, P., et al; "Write strategies for multiterabit per square inch scanned-probe phase-change memories;" Applied Physics Letters, vol. 97; pp. 173104-1 to 173104-3; Oct. 25, 2010.
Pantazi, A.; et al; "Probe-based ultrahigh-density storage technology;" IBM J. Res. & Dev.; vol. 52, No. 4/5; pp. 493-511; Jul./Sep. 2008.
Aziz, M.M.; et al; "Localized electro-thermal processing: a new route to the patterning of magnetic recording media;" Nanotechnology, vol. 21; 2010.
M. Reinhold, D. Kiener, W. B. Knowlton, G. Dehm, P. Müllner, "Deformation twinning in Ni-Mn-Ga micropillars with 10M martensite;" J. Appl. Phys. 106 (2009) 053906.

(Continued)

*Primary Examiner* — Tan T. Nguyen
(74) *Attorney, Agent, or Firm* — Parsons Behle & Latimer

(57) ABSTRACT

A data storage method includes writing data to a ferromagnetic shape-memory material in its ferromagnetic state, the material exhibiting more than two stable states. A data storage device includes a non-volatile memory element containing a ferromagnetic shape-memory alloy in a martensite state, the shape-memory alloy being ferromagnetic in a plurality of stable states of the memory element.

23 Claims, 6 Drawing Sheets

(56) References Cited

OTHER PUBLICATIONS

C.S. Watson, W.B. Knowlton and P. Mullner; "Localized Stress-Induced Twinning in Ni-Mn-Ga Single Crystals;" International Conference on Ferrmagnetic Shape Memory Alloys 2011, Dresden, Germany, Jul. 18-22, 2011.

P. Müllner, Z. Clark, L. Kenoyer, W. B. Knowlton, G. Kostorz, "Nanomechanics and magnetic structure of orthorhombic Ni-Mn-Ga martensite;" Mater. Sci. Eng., A 481-482 (2008) 66.

G. A. Shaw, J. Trethewey, A. D. Johnson, W. Drugan and W. Crone, "Thermomechanical High-Density Data Storage in a Metallic Material Via the Shape-Memory Effect;" Adv. Mater. 17 (2005) 1123.

* cited by examiner

DATA STORAGE METHODS AND DEVICES

RELATED APPLICATION DATA

The present application claims the benefit of priority under 35 U.S.C. §119 to U.S. Provisional Application No. 61/453,845 filed Mar. 17, 2011, entitled "Magnetic Shape Memory Based Multi-State Memory," which is incorporated herein by reference. The present application is also a continuation-in-part of U.S. patent application Ser. No. 12/773,831 filed May 4, 2010, entitled "Multi-State Memory and Multi-Functional Devices Comprising Magnetoplastic or Magnetoelastic Materials," which is a continuation of U.S. patent application Ser. No. 11/940,316 filed Nov. 14, 2007, now U.S. Pat. No. 7,710,766 issued May 4, 2010, entitled "Multi-State Memory and Multi-Functional Devices Comprising Magnetoplastic or Magnetoelastic Materials," which claims priority to U.S. Provisional Application No. 60/859,163 filed Nov. 14, 2006, entitled "Multi-State Memory and Multifunctional Devices Based on Magnetic Shape-Memory Alloys or Other Multi-State Materials."

TECHNICAL FIELD

The embodiments herein pertain to data storage methods and devices, for example, containing magnetic shape-memory materials.

BACKGROUND

A wide variety of electronic data storage methods and devices have been developed. For example, U.S. Pat. No. 7,586,828 issued to Ma describes a "Magnetic data storage system." Data is written on a shape memory thin film in the non-ferromagnetic austenite state by pressing an atomic force microscopy (AFM) tip into the surface. The indentation induces the martensitic transformation from a non-ferromagnetic to a ferromagnetic phase. This method makes use of the phenomenon called "stress-induced martensite formation". The information is binary: ferromagnetic/non-ferromagnetic.

Also, U.S. Pat. No. 6,084,849 issued to Durig describes "Shape memory alloy recording medium, storage devices based thereon, and method for using these storage devices." Data is written on a (non-magnetic) shape memory thin film in its (non-ferromagnetic) martensite state by pressing an AFM tip into the surface. The indent is produced by twin-boundary motion. Reading is achieved by scanning a probe over the indent. Erasing is achieved by heating the material above the martensite temperature.

Despite the unique materials used in Ma, Durig, and other known art, significant limitations exist in the described materials' ability to meet the performance expectations for modern data storage methods and devices. Accordingly, advances in the technology are conceivable.

SUMMARY

In an embodiment, a data storage method includes writing data to a ferromagnetic shape-memory material in its ferromagnetic state, the material exhibiting more than two stable states.

In another embodiment, a data storage method includes writing data to a ferromagnetic shape-memory Ni—Mn—Ga alloy in a ferromagnetic martensite state, reading the written data using a magnetic probe, and erasing the written data. The writing includes localized stress-induced deformation of the shape-memory alloy for magnetic poles to collect, thus modifying the local magnetic stray field.

In a further embodiment, a data storage device includes a non-volatile memory element containing a ferromagnetic shape-memory alloy in a martensite state, the shape-memory alloy being ferromagnetic in a plurality of stable states of the memory element.

BRIEF DESCRIPTION OF THE DRAWINGS

Some embodiments are described below h reference to the following accompanying drawings.

DETAILED DESCRIPTION

Figure 1:
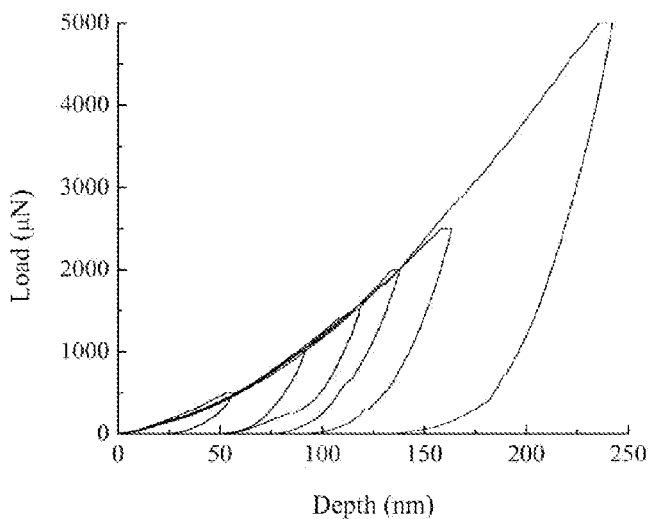
FIG. 1: Representative load-displacement curves of Ni—Mn—Ga with peak loads of 0.5, 1.0, 1.5, 2.0, 2.5 and 5.0 mN. The axis of easy magnetization (c-axis) was normal to the bad train. All indentations were performed at a ramp rate of 10 s and a dwell time at the peak bad of 5 s.

With the development of ferromagnetic shape memory alloys (MSMA), the reversible shape change of shape memory alloys can be controlled with not only temperature or applied stress but with a magnetic field as well. Strong coupling between magnetization and structural order enable rapid actuating response in the kHz regime with large magnetic-field-induced strains (MFIS). The large MFIS (direct effect) and deformation-induced change in magnetization (inverse effect) enable applications ranging from actuators and sensors to power generation, energy harvesting, and memory storage.

The mechanism for large strains, induced by mechanical stress or magnetic field, is the preferential growth and alignment of martensite variants, through twin boundary motion, to the direction of the applied field. In the case of Ni—Mn—Ga based alloys, MFIS up to 10% has been reported by A. Sozinov, A. A. Likhachev, N. Lanska and K. Ullakko, *Appl.*

*Phys. Lett.* 80, 1746 (2002). MFIS may be permanent (magnetoplasticity) or magnetoelastic. For magnetoelasticity, the induced rearrangement of the twin microstructure, is reversible upon the removal of the applied magnetic field.

The application of a magnetic field while in the low temperature martensite phase results in martensite variant reorientation, twin boundary motion and a permanent, macroscopic shape change. As with the stress induced permanent deformation of conventional shape memory alloys, the original shape can be thermoelastically recovered. This conventional shape memory effect (SME), using nickel-titanium shape memory alloys, has been leveraged in the development of alternative data storage devices, as discussed in an article by G. A. Shaw et al., *Adv. Mater.* 17, 1123 (2005) entitled "Thermomechanical High-Density Data Storage in a Metallic Material Via the Shape-Memory Effect." By performing nanoindentation below the martensitic phase transformation temperature, residual impression is formed, which upon heating to the austenite phase, partially transforms to its original shape. Complete recovery to the original, undeformed state, has not been achieved. The lack of complete recovery is associated with highly localized stresses forming beneath the indentation probe inducing plastic deformation by dislocation motion, which is not recoverable. Another potential technique, where plastic deformation does not limit applicability, where reading is not restricted to mechanical contact and erasing does not rely on thermal input, is to apply the nanoindentation patterning technique on magnetic shape memory alloys, which is one of the embodiments described herein.

While the macroscopic thermo-magneto-mechanical properties of MSMA, in particular Ni—Mn—Ga, have been established, studies linking nanoscale deformation to local properties are limited. In an article by P. Müllner et al., *Material Science Eng.*, A 481-482, 66 (2008) entitled "Nanomechanics and magnetic structure of orthorhombic Ni—Mn—Ga martensite", it was shown, using cantilever based indentation techniques on Ni—Mn—Ga, that up to 70% of the indentation deformation is recoverable upon unloading without the introduction of heat. The mechanism for the large recoverable deformation was attributed to pseudo-elastic twinning. Post indentation analysis, using a combination of atomic force microscopy (AFM) and magnetic force microscopy (MFM) did not reveal a change in the local twinning and magnetic field patterns.

In "Deformation twinning in Ni—Mn—Ga micropillars with 10M martensite" (M. Reinhold, et al., J. Appl. Phys. 106 (2009) 053906), small, free-standing pillars with 10 to 15 μm diameter were deformed in compression with a truncated tip of a micro-indenter. The occurrence of twinning was detected with magnetic-force microscopy. Twin-reorientation was achieved in a free-standing pillar (microstructure). Twinning was enabled and promoted by free surfaces. The substrate material obstructed the formation of twins. This paper studies the deformation mechanics and does not discuss the utilization of twinning for data storage. In contrast, embodiments herein may produce twin-reorientation in a bulk material without the need of microstructuring/free surfaces. If the procedure described in Reinhold were used for data storage (which is not discussed in Reinhold), then the storage density would be limited by the process of structuring the pillars, which is not necessarily the case for the embodiments herein.

In an embodiment, a method for writing, reading, and erasing data includes using a ferromagnetic shape-memory alloy in its ferromagnetic martensite state. Writing is achieved via pressing a sharp mechanical probe in the material. The data is stored in the form of magnetic poles where the orientation of the magnetic moments correlates with the local orientation of the crystal lattice. Four magnetic-based memory states are possible due to magnetic field or stress-induced twin rearrangement along two crystal orientations, each with two possible magnetic orientations. Reading is achieved via magnetic sensing and/or mechanical sensing. Erasing is achieved via a variety of methods including magnetic fields, mechanical force, and heat. Erasing is achieved both locally and globally.

An embodiment of the present disclosure is directed to a device including non-volatile memory containing a ferromagnetic shape-memory alloy in the martensite state. In an embodiment, writing of data to the memory can be accomplished by local heating. For example, the local heating can be achieved by applying a voltage on a probe or by using a laser beam. In an embodiment, writing of data can be accomplished by localized stress-induced reorientation of the crystal lattice. For example, localized stressing can be achieved by indentation. In an embodiment, writing of data can be accomplished by localized reorientation of the crystal lattice by the application of a localized magnetic field. For example, a localized magnetic field can be produced by a coil or by a permanent magnet.

Erasing of data can be accomplished, for example, by global or local heating or global or local application of a magnetic field or by global or local application of a mechanical force. Reading of the data can be accomplished using a magnetic probe. Examples of suitable probes include a magnetic-force microscopy tip, a coil, or a Hall probe. Reading may also be accomplished using an atomic force microscopy tip, optical profilometry, the magneto-optical Kerr effect, reflection of an optical signal, or scattering an electromagnetic or particle signal.

In an embodiment, the ferromagnetic shape memory alloy comprises single crystalline material. The ferromagnetic shape memory alloy can be a thin film, such as a single crystalline thin film. The thin film can be formed by any suitable method. For example, the thin film can be grown on a substrate using epitaxial techniques or other methods.

Nickel-manganese-gallium (Ni—Mn—Ga) and other ferromagnetic shape memory alloys exhibit large magnetic-field-induced strains (MFIS) that are attractive for magnetic actuator and sensor applications. The MFIS mechanisms of Ni—Mn—Ga (and other ferromagnetic shape memory alloys) are the result of high magnetic crystallographic anisotropy and low twinning stress, which enable twin boundary motion. The stress-strain response of Ni—Mn—Ga at the nanoscale may provide additional insights into the mechanisms leading to macroscopic strain. To this end, indentation-based techniques were used to induce local stress-induced changes in the twin microstructure and in the magnetic domain structure. A framework is established enabling the patterning of information via a nanomechanical writing process and a magnetic reading mechanism, using instrumented indentation and scanning probe microscopy (SPM) techniques.

Accordingly, unlike Ma (U.S. Pat. No. 7,586,828) discussed in the Background above, the embodiments herein may apse a ferromagnetic shape-memory alloy in its martensite state. Data may be written by indentation techniques or any technique that locally deforms the device surface. The locally deformed surface disrupts the magnetic flux. This disruption results in the formation of positive and negative magnetic poles on opposite sides of the plastically deformed regions, which modifies the local stray field. Magnetic information, by way of the magnetic poles is stored about the locally deformed region. The information may thus be stored in the orientation of the magnetic moment, which is not the case in Ma. Therefore, multiple states may be attainable, such as magnetization left/right/up/down/forward/backward, which is not the case in Ma. Known memory technologies often include a memory element capable of storing information as a stable state of the medium. Many elements are binary, or have two stable states, usually corresponding to 0 and 1 for digital data storage. It will be appreciated that embodiments herein may enable more than two stable states, for example, four stable states for multi-state or multi-bit memory.

Also, unlike Dung (U.S. Pat. No. 6,084,849) discussed in the Background above, the embodiments herein may use a ferromagnetic shape-memory alloy. Information may be stored in multiple forms including magnetic states, which is not the case in Durig. Reading and erasing may be achieved with magnetic means, which is not the case in Durig.

The crystallographic c direction is parallel to one of three orthogonal axes x, y, and z, constituting three crystallographic states or orientation states. The strong magnetocrystalline anisotropy forces the local magnetization parallel to the crystallographic c direction. For each orientation state, the magnetization vector can point in two directions, which are parallel to c but mutually opposite. There are two magnetic states per orientation state. In total, there are six distinguishable states, For this study, indentation techniques were performed on Ni—Mn—Ga single crystals, which resulted in modifying the local magnetic field. Thus, understanding the constraints, magnitude and mechanisms of stress-induced twinning and magnetization at small length scales may be considerations to assist in putting the embodiments into effect.

Example 1

As an example, indentation experiments were performed on a parallelepiped Ni—Mn—Ga single crystal with 10M martensite structure and martensite transformation temperatures above room temperature. The Ni—Mn—Ga single crystal had an electropolished surface with faces parallel to the {100} planes.

A nanomechanical test system (TS-75 TriboScope, Hysitron, Inc., Minneapolis, Minn.) coupled with an atomic force microscope (Dimension 3100 Scanning Probe Microscope, Bruker Nano, Inc., Santa Barbara, Calif.) was used to measure topography, magnetic structure and to probe the nanomechanical properties. Load controlled nanoindentations were made with a Berkovich diamond indenter with a nominal radius of curvature between 100-200 nm. Microindentation was performed using a microhardness tester (Leco, DM-400F) with a Vickers diamond indenter. Following indentation, the residual indentation induced impressions were imaged using AFM and MFM techniques with a ferromagnetic CrCo coated tip. All experiments were performed under ambient laboratory conditions, i.e., the Ni—Mn—Ga sample was in the martensite phase.

Figure 2:
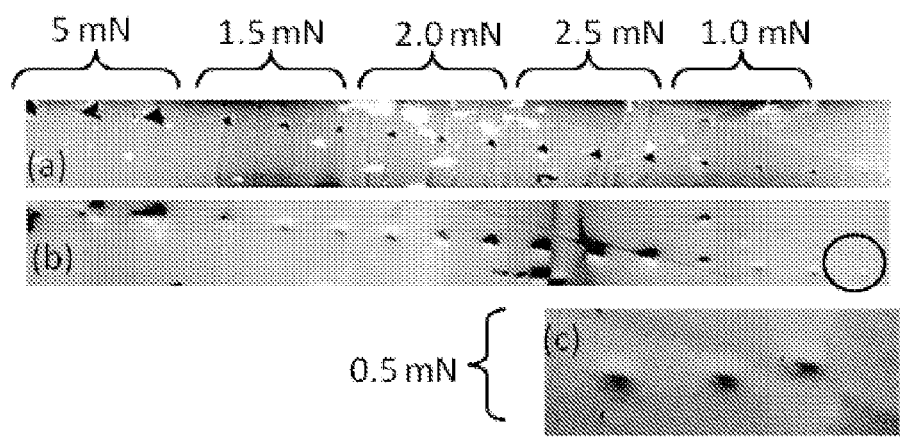
FIG. 2: Representative AFM (a) height and (b) MFM phase contrast image of an array of residual nanoindentation-induced impressions. (c) Even at the lowest loads, 0.5 mN, a phase contrast representing a change in the magnetic field from in-plane to out-of-plane was achieved. The image size for (a) and (b) is 59×5.7 µm and for (c) is 6.9×2.4 µm.

Representative nanoindentation load-displacement curves with peak loads of 0.5, 1.0, 1.5, 2.0, 2.5 and 5.0 mN are shown in FIG. 1. The crystallographic c-axis direction, i.e., the easy axis of magnetization, was parallel to the surface, and the crystallographic a-axis direction was perpendicular to the surface. Depending on the peak load, the residual indentation depth ranged between 30 to 180 nm. The corresponding AFM height and MFM phase contrast images of the nanoindentations are shown in FIGS. 2(a) and 2(b) respectively. The MFM image reveals a change in the magnetic contrast from neutral to strong contrast (black and white) for regions deformed during nanoindentation. The change in contrast indicates a localized magnetic structure modification from in-plane to out-of-plane magnetization. Even at the lowest peak loads, 0.5 mN, a change in magnetic contrast was induced (FIG. 2c).

Figure 3:
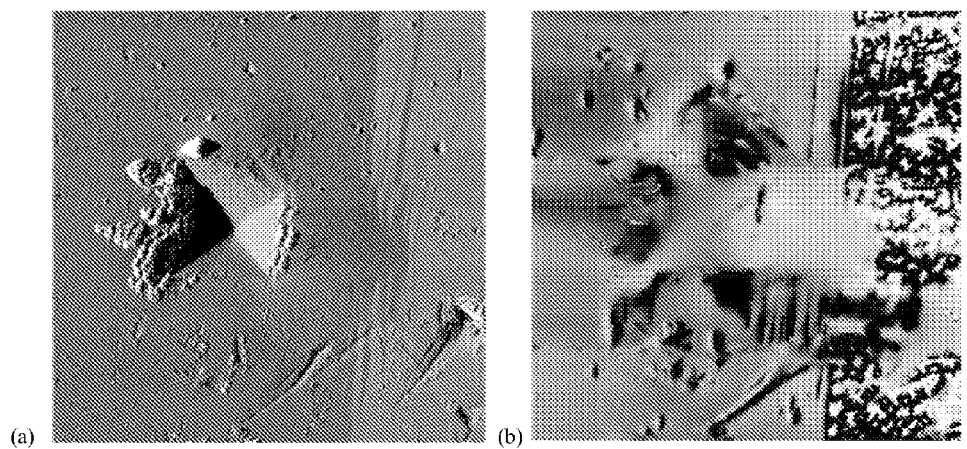
FIG. 3: Representative AFM (a) amplitude error and (b) MFM phase contrast image (50×50 µm) of a residual Vickers microindentation-induced impression. The peak bad was 981 mN with a 15 s dwell time. The images dearly show, by way of the twinning bands, localized stress-induced twinning and a corresponding change in magnetization.

To enable direct verification of localized stress-induced twinning, a 981 mN bad Vickers microindentation was performed on the Ni—Mn—Ga single crystal on a crystallographic domain with c-axis parallel to the surface but close to a twin boundary where the c-axis direction changes to perpendicular to the surface. As shown in FIG. 3, the localized bad resulted in the nucleation of twins and twin boundary motion. The twin bands seen in FIG. 3a, as a result of twin variant reorientation, correspond to a change in the direction of the local magnetization (FIG. 3b). Within the in-plane region (left), the twinning bands comprise out-of-plane magnetization. The dark regions indicate the magnetic moment is pointing into the sample surface. For the out-of-plane region (right side art FIG. 3b), only one twin band is observed. The high magnetic contrast within the out-of-plane region overwhelms the magnetic contribution from the other twin bands. However, a large swath, adjacent to the indentation, of an induced change in magnetization extends through the twin boundary.

When nanoindentation and microindentation was performed within out-of-plane regions (such as the right side of FIG. 3a,b), the contrast changed locally from a strong (black and white) contrast to more neutral contrast similar to that shown in FIG. 3.

Reflecting on Example 1 above, this work demonstrates that the use of indentation techniques on Ni—Mn—Ga single crystals induce a localized change in the magnetic structure. The change in the magnetic structure may be sensed with scanning probe microscopy techniques, in particular, AFM and MFM. The controlled change in the magnetic response at this scale enables the patterning, or writing, of magnetic information for memory applications.

Writing may also be achieved by local heating possibly in combination with a global or local mechanical force or in combination with a global or local magnetic field. For this, the indentor, such as the Berkovich indentor discussed above, may be substituted with a laser beam or a voltage probe. Both methods can provide sufficient heat in a narrowly confined volume. Details of the writing process depend on the specific material. When using the magnetic shape-memory alloy Ni—Mn—Ga, the material is heated to above the order-disorder temperature. This forms the B2' phase. The B2' phase does not transform martensitically upon cooling. For erasing, the material is heated to a lower temperature, where the ordered $L2_1$ phase forms. This erasing process is different than erasing after indentation. Erasing after indentation may use less heat because the sample may be heated only just above the martensite temperature.

It will be appreciated that indentations changed the local magnetic contrast in Ni—Mn—Ga as demonstrated using AFM/MFM for twin variants with c in-plane and c out-of-plane. Also, a 981 mN load indentation resulted in significant twin development on the in-plane surface, which extended into the neighboring twin with c out-of-plane surface. Thus, controlled, localized, stress-induced twinning using indention techniques may enable the patterning of magnetic information.

Example 2

Nanoindentation, atomic force microscopy (AFM) and magnetic force microscopy (MFM) was performed with a scanning probe microscope (Dimension ICON and 3100.

Scanning Probe Microscope, BrukerNano, Inc., Santa Barbara Calif.) to indent and to measure topography and magnetic structure. Nanoindentation arrays were created to evaluate the effect of indentation spacing and size on the magnitude and morphology of the local magnetic response. The stresses associated with nanoindentation using a sharp diamond probe (PDNISP, Bruker AFM Probes, Camarillo, Calif.) resulted in plastic deformation, through a combination of lattice and twinning dislocations, which resulted in a change in the local magnetic structure sensed using MFM. This work demonstrates that the local magnetic structure can be controlled by indent spacing and size, which can be leveraged for the patterning of magnetic information for memory applications.

Indentation experiments were performed on a parallelepiped Ni—Mn—Ga single crystal with 10M martensite structure and martensite transformation temperatures above room temperature. The faces of the single crystal were parallel to the $\{100\}$ planes. One face of the Ni—Mn—Ga single crystal was mechanically lapped with 1200 grit SiC paper and sequentially polished using 9, 3 and 1 μm diamond slurries and finished with a 0.3 μm alumina slurry. The single crystal was then electropolished in 70 parts reagent alcohol and 30 parts nitric acid with an applied voltage of 2 VDC for 15 s.

A series of 5×5 arrays of indentations were made on the polished face of the single crystalline Ni—Mn—Ga. For these arrays, indentation loads ranged from ~5 to 26 μN with spacing from 25 to 200 nm. Indentations were made with a four-sided pyramidal diamond tip with a nominal radius of curvature of 40 nm. Following indentation, AC mode and constant height imaging was performed using CoCr coated silicon cantilevers. Corresponding height and MFM phase images are shown in FIGS. 4a and b. Prior to indentation, the entire surface exhibited neutral contrast. Because of the high magnetocrystalline anisotropy of Ni—Mn—Ga, neutral contrast is indicative of the c-axis, thus the magnetization, parallel to the surface. For regions plastically deformed by nanoindentation, the MFM image reveals a localized change in the magnetic stray field from neutral to strong contrast (black and white). The change in contrast indicates a localized magnetic structure modification from in-plane to out-of-plane magnetization. Because of the high magnetocrystalline anisotropy of Ni—Mn—Ga, the dark and bright regions are often indicative of domains within a martensite variant with the c-axis normal to the sample surface. However, for this to be the case, stress associated with forming an indentation may induce preferential alignment of twinning dislocations. In this scenario, each indentation results in the formation of a martensite variant (or twin) with two domains—one with the c-axis out of (bright contrast) and into (dark contrast) the surface.

Figure 5:
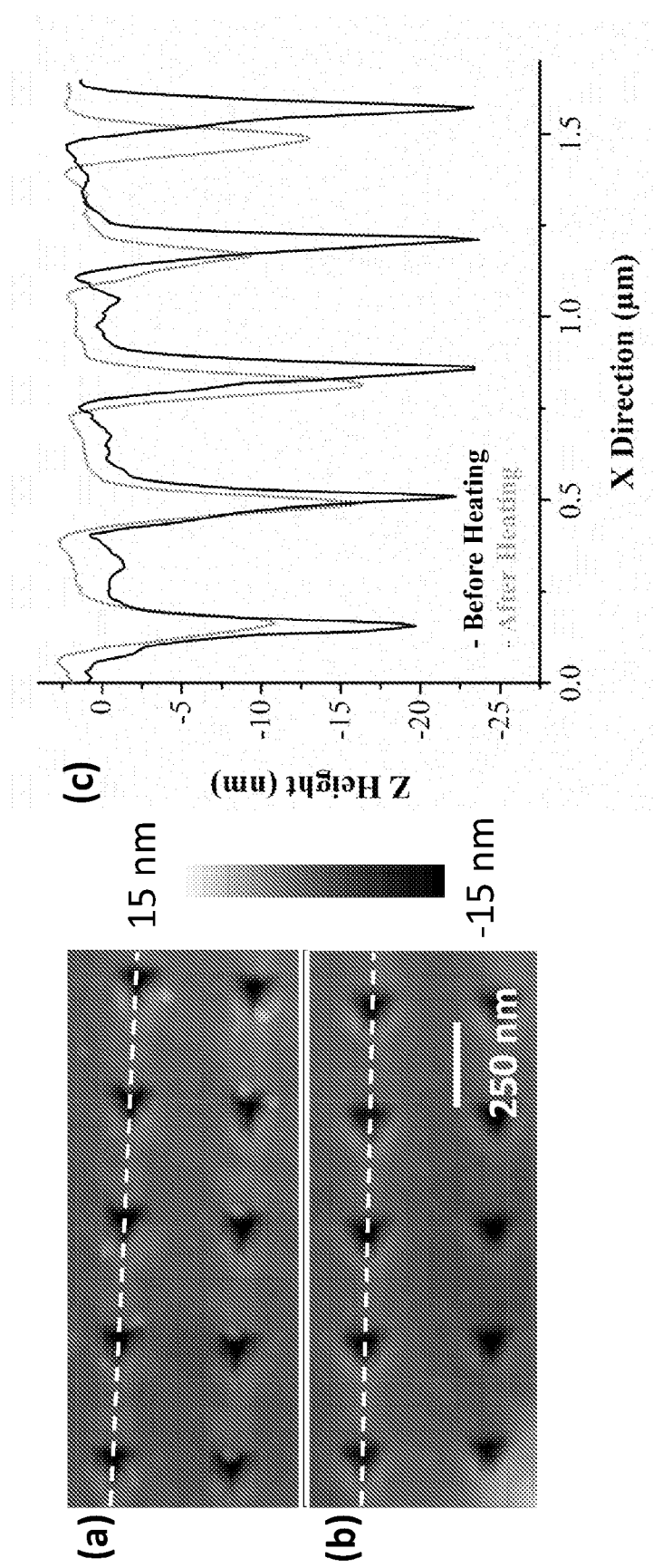
FIG. 5: A portion of a 26 µN/300 nm array (a) before and (b) after heating through the martensitic phase transformation with (c) showing a line scan that demonstrates the resulting difference in indentation depths.

In an attempt to determine the contribution of stress-induced twinning on the modification of the local magnetic structure, the Ni—Mn—Ga sample was heated through the martensite phase transformation temperature, held in the austenite phase at 75° C. for 20 min, cooled to room temperature and re-imaged. By cycling through the martensitic phase transition, stress-induced twins are able to thermoelastically recover. Thus, at room temperature, if a percentage of the plastic deformation induced during indentation is from twinning, the indent depth should partially recover. FIG. 5 shows a portion of a 26 μN/300 nm array before (FIG. 5a) and after (FIG. 5b) heating through the martensitic phase transformation. Prior to heating, the indentation depth, based on averaging the maximum depths for each of the 10 indentations, was 21.9±2.2 nm. Upon cooling to room temperature from 75° C., the indentations partially recovered to a depth of 15.0±2.7 nm. A line scan in FIG. 5c demonstrates the difference in indentation depths. On average, the indentations exhibited 30.8% recovery upon cycling through the martensitic phase transformation. As a result, the stresses generated during indentation result in both lattice and twinning dislocations. This is evident by only the partial recovery of the indent; the indent remnant is permanently deformed due to lattice dislocations. In addition, the magnetic contrast still persists, even after being thermoelastically recovered. Therefore, localized stress-induced twinning does not significantly contribute to the change in magnetic structure.

For the 26 μN/200 nm array in FIG. 4b, each indentation directly correlates with a dark and bright region. Along the horizontal direction, the dark and bright regions tend to merge so that the response appears to be more of a continuous line instead of indentation independent/isolated regions of induced changes in magnetic contrast. When the spacing was reduced further, from 200 to 100 nm, a change in the local magnetic contrast was induced, but instead of each row exhibiting dark and bright contrast, an intriguing coupling occurred within the array. Only the top and bottom showed significant changes in magnetic contrast; the middle rows are neutral contrast. The magnitude of the dark and bright regions is intensified compared to the 26 μN/200 nm array as well. Decreasing the load from 26 μN to 13 and 10 μN resulted in a change in magnetic contrast more in line with the 26 μN/200 nm array: dark-bright contrast for each row of indentations. Reducing the load (7.5 and 6.5 μN) and spacing (to 50 nm) even further resulted in a magnetic response similar to 26 μN/100 nm array: the contrast was more significant at the bottom and top rows of the array, where the remaining rows exhibited more of a neutral contrast. From this series of indentation arrays, four major trends were observed: (i) each indentation results in both dark and bright contrast, (ii) a directionality of dark to bright contrast exists, where dark contrast is below the bright contrast, (iii) as the indentation load decreases the magnitude of the magnetic contrast decrease, (iv) indentation induced magnetic stray fields couple to neighboring stray fields and (v) the top and bottom edge of small pitched arrays have an enhanced dark/bright contrast.

Figure 6:
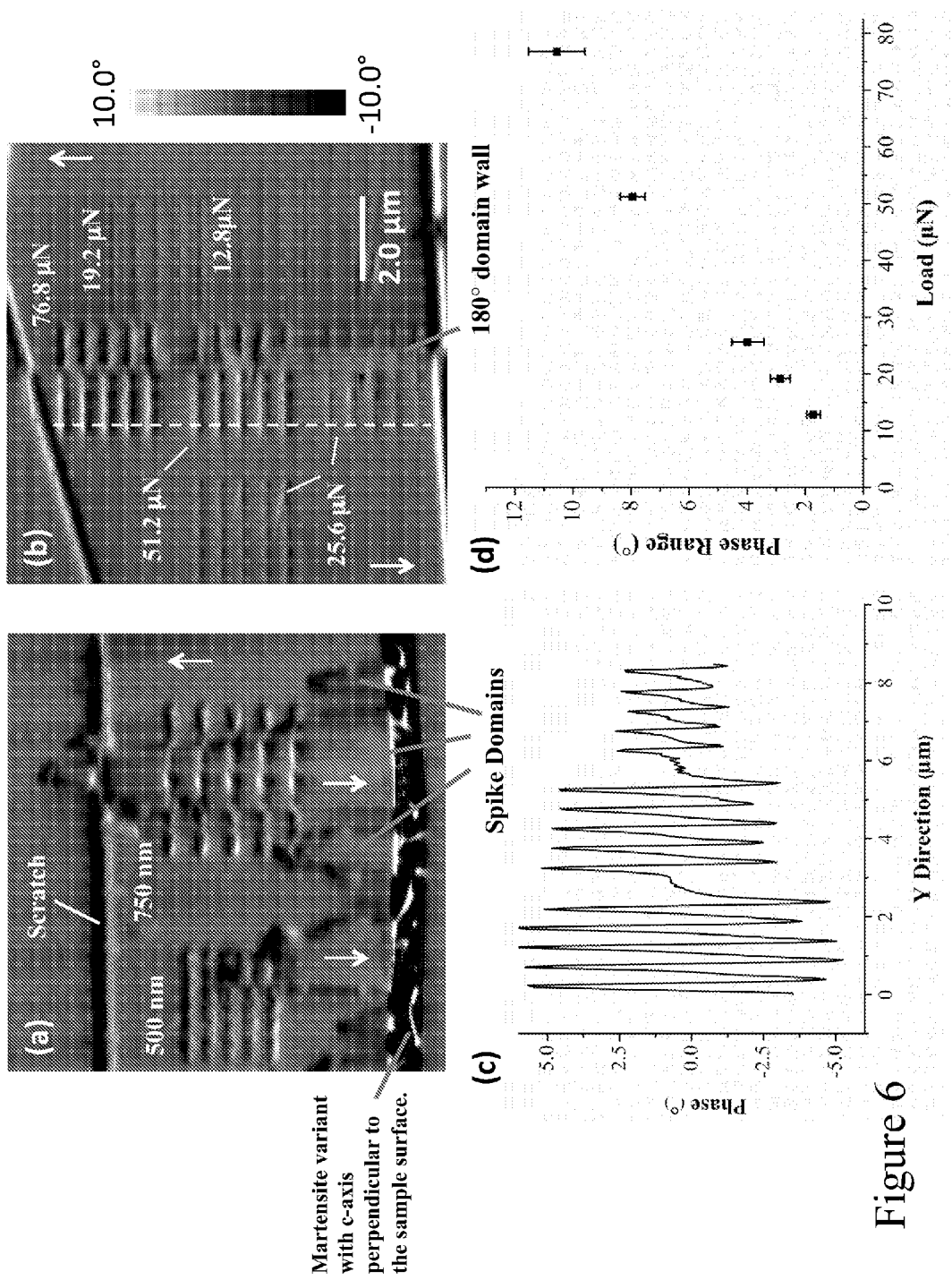
FIG. 6: MFM images of arrays (a) created using a load of 128 µN with a period of 500 and 750 nm and (b) created using a constant pitch of 500 nm while the indentation load varied from 12.8 to 76.8 µN with (c) a cross section of the magnetic contrast for a column of indentations formed by an applied load of 76.8, 51.2 and 25.6 µN and (d) a graph of the relationship between the applied load and the magnetic contrast for the arrays in FIG. 3b.

The contributions to the modification to the local magnetic stray field are not deformation related, instead, the magnetic contrast in the MFM images, are the result of creating new surfaces for magnetic poles to collect. Similar to the principles of magnetic particle inspection, Betz, C. E. *Principles of magnetic particle testing*. (Magnaflux Corp., 1967), and the Bitter method, Bitter, F. On inhomogeneities in the magnetization of ferromagnetic materials. *Phys. Rev.* 38, 1903-1905, doi:10.1103/PhysRev. 38.1903 (1931), where magnetic stray fields facilitate the imaging of magnetic inhomogeneities (such as cracks and domain walls), MFM senses the magnetic stray fields emanating from the sample. On the nanoscale, the indentations disrupt, locally, the magnetic flux. This disruption results in the formation of positive and negative magnetic poles on opposite sides of the plastically deformed regions, which modifies the local stray field. While imaging, the probe, magnetized normal to the sample surface, is repelled (bright contrast) from the positive poles and attracted (dark contrast) to the negative poles. The directionality of the dark to bright contrast is associated with the c-axis and the magnetization direction. The MFM images in FIG. 6 provide an eloquent demonstration of this relationship. A load of 128 μN with a period of 500 and 750 nm were used to create the arrays in FIG. 6a. For the arrays in FIG. 6b, a constant pitch of 500 nm was maintained while the indentation bad varied from 12.8 to 76.8 μN. The MFM images show a variety of magnetic features: (i) spike domains, (ii) out of and in-plain twin variants, (iii) a 180° twin boundary and (iv) indentation and scratch induced changes in magnetization. The magnetic features emanating from the out-of to in-plane twin boundary are a form of spike domains (FIG. 6a). Spike domains, which are 180° domains, form to minimize magnetostatic energy and are often associated with pinning sites (inclusions, pores, chemical inhomogeneities, grain boundaries), surfaces that are slightly tilted from the crystallographic easy axis of magnetization and at twin boundaries. As would be expected for a twin variant with magnetization parallel to the surface, the intersection of indentation arrays with the spike domains result in a reversal of the dark/bright contrast direction. Similarly, an indentation array intersects an in-plane 180° domain wall (FIG. 6b) exhibiting a corresponding change in the directionally of the dark/bright contrast. On one side of the array, the dark/bright contrast is from bottom to top and on the other side, the contrast is from top to bottom. In addition, indentation arrays on either side of the 180° domain wall exhibit the same phenomenon. The location of positive and negative magnetic poles that collect within topological features, such as scratches and indentations, is dependent on the magnetization vector. Positive poles, thus bright contrast, collect on the surface intersecting the direction of magnetization. Thus, by changing the magnetization direction through twin boundary motion, either with an applied magnetic field or stress, a four-state memory is possible.

From FIG. 6b, as the indentation load increases, the magnitude of the magnetic contrast in the MFM images increases. As stated previously, during indentation, the surface is deformed which disrupts the continuity of the magnetic flux through the sample. Magnetic poles on opposite sides of the indentation result in a magnetic stray field, which is sensed using MFM. FIG. 6c shows a cross section of the magnetic contrast for a column of indentations formed by an applied load of 76.8, 51.2 and 25.6 µN. The phase shift, due to the interaction of the CoCr coated silicon probe with the magnetic stray field emanating from the indentations, decreased with decreasing load, from a full range of 10.5 to 7.8 to 4.0°, respectively. FIG. 6d shows the relationship between the applied load and the magnetic contrast for the arrays in FIG. 6b. Rudimentarily, the higher the indentation load, the more surface area that is deformed, thus a greater amount of magnetic poles form, which results in a higher magnetic contrast.

Figure 4:
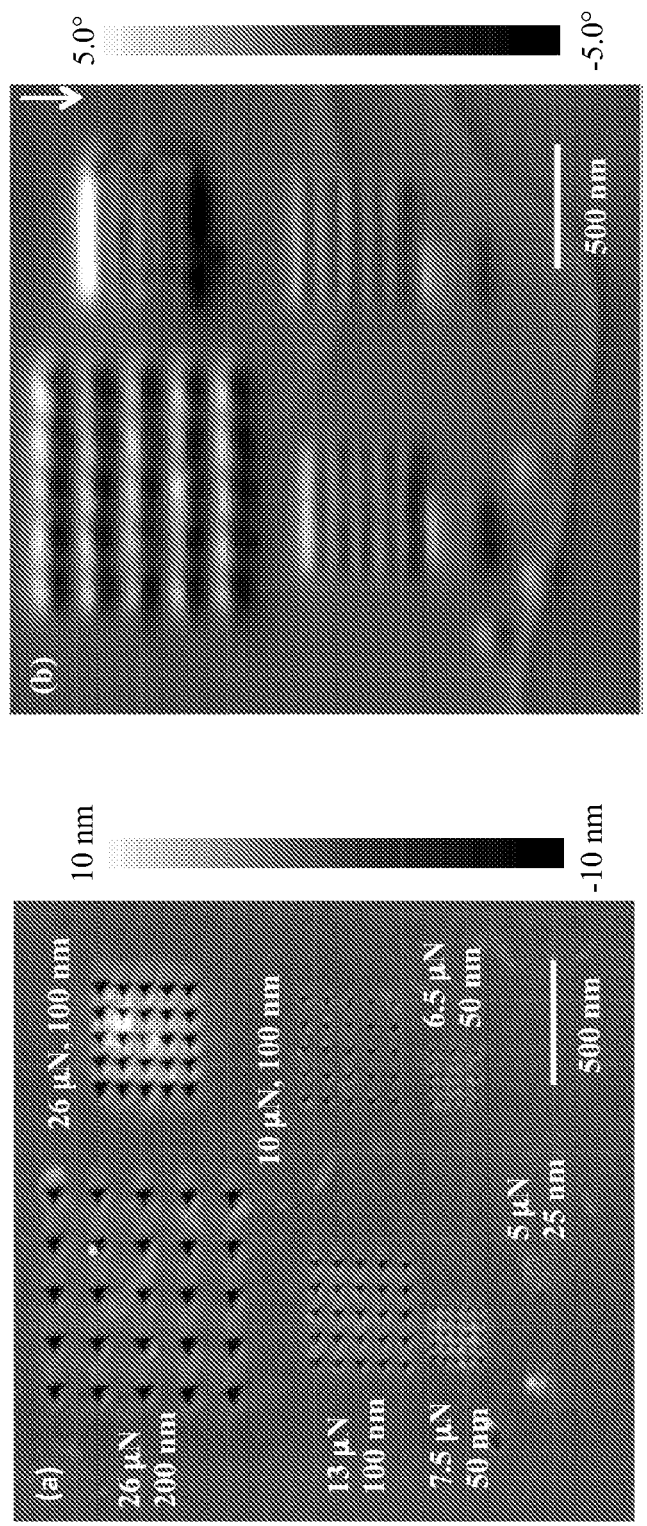
FIG. 4: Corresponding (a) height and (b) MFM phase images for a series of 5×5 arrays of indentations on the polished face of single crystalline Ni—Mn—Ga.
Figure 7:
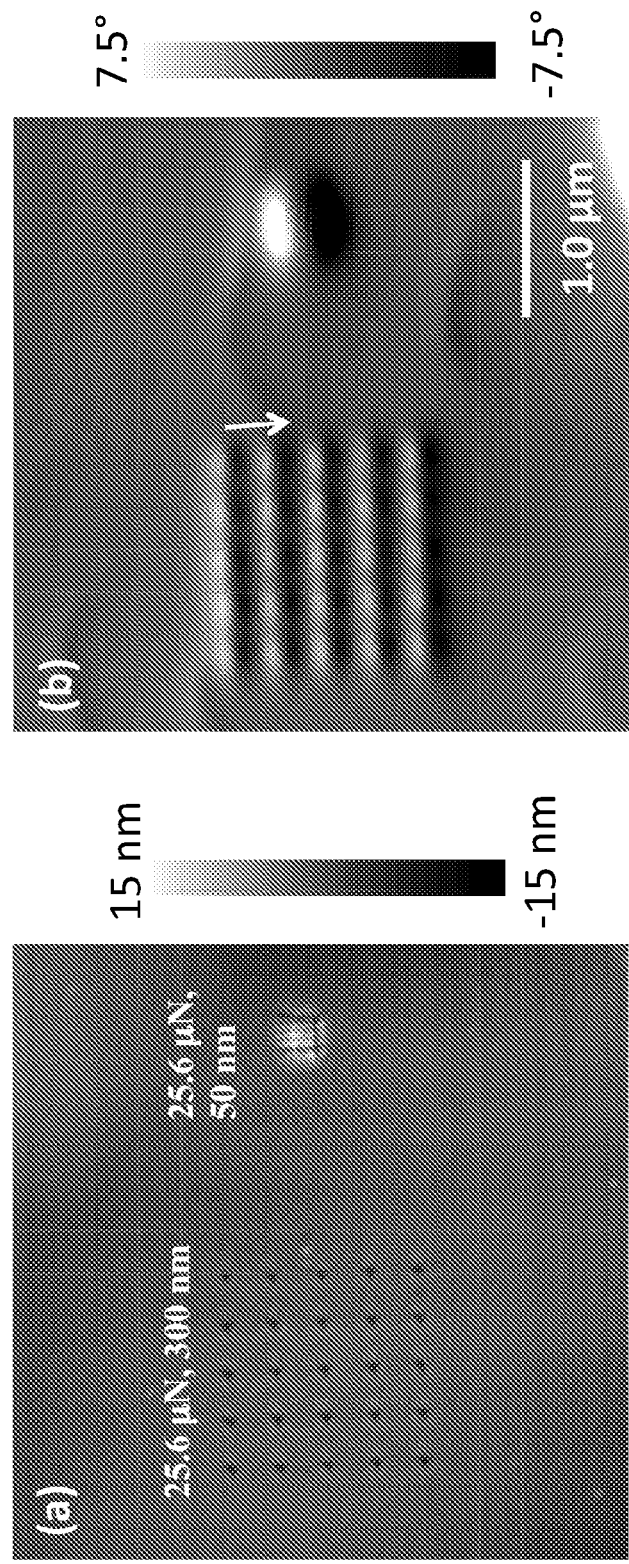
FIG. 7: Corresponding (a) height and (b) MFM phase images for two 5×5 arrays of indentations on the polished face of single crystalline Ni—Mn—Ga.

An apparent coupling of the magnetic stray fields emanating from the indentations results in the formation of linear regions with a persistent stray field, herein referred as linear coupling, of dark or bright contrast (FIGS. 4, 6 and 7). The height of the MFM probe above the sample may play a role in coupling. The coupling could also be probe related, keeping in mind the lateral resolution of MFM is 20-50 nm, depending on the probe radius of curvature. Both of these scenarios are relevant, but do not address the consistent coupling of magnetic stray fields for a variety of indentation loads and spacing. At a constant pitch (500 nm), the systematic increase in load (FIG. 6) first results in each indentation exhibiting a distinct dark/bright contrast. However, at a load of 51.2 µN, linear coupling becomes evident and is more prevalent for the array formed with a 76.8 µN load. As the pitch is decreased for a constant load (26 µN) from 500 nm (FIG. 6b), 300 nm (FIG. 7). 200 nm (FIG. 4), 100 nm (FIG. 4) and 50 nm (FIG. 7), initially no coupling is observed, only magnetic contrast is present within each indentation. However, at 300 nm spacing the magnetic stray field from each indentation begins to couple with neighboring indentations. As the spacing is decreased to 100 nm, an interesting coupling phenomenon occurs, in which the magnetic poles appear to accumulate at the top and bottom of the indentation array, resulting in a magnetic stray field with an enhanced dark and bright contrast. The enhanced coupling becomes even more pronounced as the indentations become indistinguishable because the spacing between indents is on the order of the indentation contact area or less (FIG. 7). Thus, based on the data storage requirements, the indentation spacing and load can be designed to pattern the appropriate magnetic structure.

Reflecting on Example 2 above, this work demonstrates that a localized change in magnetization may be controlled using indentation techniques. The competition between the applied load and pitch size on influence the design of appropriate considerations useful for memory applications. Controlling the magnitude of the magnetic contrast through indentation load may be used for multi-bit memory applications. Controlling the direction of magnetization enables a four-state memory device.

Further, observation indicates that the formation of topological features through indentation-based techniques changes the local magnetic contrast in Ni—Mn—Ga as demonstrated using AFM/MFM. Accordingly, controlled, localized changes in magnetization may be designed with indentation loads and spacing. Twin induced deformation and lattice dislocations apparently accommodated the high stress fields during indentation. Also, localized twinning deformation thermoelastically recovered and localized stress-induced twinning did not significantly contribute to the change in magnetic structure. The magnetic contrast sensed with MFM, emanating from indentations, were the result of creating new surfaces for magnetic poles to collect. With indentation and AFM/MFM techniques, the axis of easy magnetization and magnetization direction may be determined for in-plane and out-of-plane magnetization. Linear and enhanced magnetostatic coupling was demonstrated and is influenced by indent spacing and size. As a result, by controlling indentation load and spacing, Ni—Mn—Ga may be suitable for multi-bit memory applications.

The surface topography may be created by any other method; for example, the surface topography can be created by ion beam machining or by electron beam lithography.

In compliance with the statute, the embodiments have been described in language more or less specific as to structural and methodical features. It is to be understood, however, that the embodiments are not limited to the specific features shown and described. The embodiments are, therefore, claimed in any of their forms or modifications within the proper scope of the appended claims appropriately interpreted in accordance with the doctrine of equivalents.

The invention claimed is:

1. A data storage method comprising:
  writing data to a ferromagnetic shape-memory material in its ferromagnetic state by creating surfaces for magnetic poles to collect, the material exhibiting more than two stable states; and
  erasing the written data.

2. The method of claim 1 wherein the material comprises an alloy in a martensite state.

3. The method of claim 1 wherein the material comprises a ferromagnetic shape memory alloy.

4. The method of claim 1 wherein the material exhibits four stable states.

5. The method of claim 1 wherein the writing comprises local heating.

6. The method of claim 5 wherein the local heating comprises applying a voltage on a probe or using a laser beam.

7. The method of claim 1 wherein the writing comprises localized stress-induced deformation resulting in a local change in the magnetic structure.

8. The method of claim 7 wherein the localized stress inducement comprises indentation.

9. The method of claim 1 further comprising erasing data by heating.

10. The method of claim 9 wherein the heating comprises local heating.

11. The method of claim 1 further comprising erasing data by applying a magnetic field.

12. The method of claim 11 wherein the magnetic field is applied locally.

13. The method of claim 1 further comprising reading data with a magnetic probe.

14. The method of claim 13 wherein the magnetic probe is a magnetic-force microscopy tip, a coil, or a Hall probe.

15. The method of claim 1 further comprising reading data using an atomic force microscopy tip, optical profilometry, a magneto-optical Kerr effect, reflection of an optical signal, or scattering of an electromagnetic or particle signal.

16. The method of claim 1 wherein the writing comprises applying a localized magnetic field.

17. A data storage method comprising writing data to a ferromagnetic shape-memory material in its ferromagnetic state, the material exhibiting more than two stable states and the data being written in the form of creating new surfaces for magnetic poles to collect, where the magnetic stray field correlates with magnetization and a local orientation of a crystal lattice.

18. The method of claim 17 wherein the writing comprises localized reorientation of the crystal lattice for magnetic poles to collect at different surfaces.

19. The method of claim 18 wherein the reorientation comprises applying a localized magnetic field.

20. A data storage method comprising:
    writing data to a ferromagnetic shape-memory Ni—Mn—Ga alloy in a ferromagnetic martensite state, the writing including localized stress-induced deformation of the shape-memory alloy for magnetic poles to collect, thus modifying the local magnetic stray field;
    reading the written data using a magnetic probe; and
    erasing the written data.

21. A data storage device comprising an epitaxial, thin film, non-volatile memory element supported by a substrate and containing a ferromagnetic shape-memory alloy in a martensite state, the shape-memory alloy being ferromagnetic in a plurality of stable states of the memory element.

22. The device of claim 21 wherein the alloy comprises Ni—Mn—Ga.

23. The device of claim 21 wherein the ferromagnetic shape-memory alloy comprises a single crystal.

* * * * *